(12) United States Patent
Moulthrop et al.

(10) Patent No.: US 6,211,663 B1
(45) Date of Patent: Apr. 3, 2001

(54) BASEBAND TIME-DOMAIN WAVEFORM MEASUREMENT METHOD

(75) Inventors: Andrew Alfred Moulthrop, Los Angeles; Michael Steven Muha, Torrance; Christopher Joseph Clark, Hermosa Beach; Christopher Patrick Silva, Rancho Palos Verdes, all of CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 09/322,270

(22) Filed: May 28, 1999

(51) Int. Cl.[7] .............................. G01R 23/16; G01S 7/40
(52) U.S. Cl. ..................... 324/76.23; 324/76.19; 324/76.21; 324/615; 342/165; 342/173
(58) Field of Search ..................... 324/612, 615, 324/629, 76.19, 76.21, 76.23, 76.39, 76.52, 76.78, 132; 342/165, 173, 174; 340/825.06

(56) References Cited

U.S. PATENT DOCUMENTS 4,510,622 * 4/1985 Mori et al. .............................. 455/67

5,920,281 * 7/1999 Grace .................................. 342/165

* cited by examiner

*Primary Examiner*—Glenn W. Brown
(74) *Attorney, Agent, or Firm*—Derrick Michael Reid

(57) ABSTRACT

A time-domain baseband measurement method measures modulated microwave signals typically used in communication systems by converting microwave signals to baseband before measurement for improved accuracy compared to direct measurement at the microwave frequency. A downconverting receiver is first characterized using a prior characterization method and then the modulated microwave signal is applied to the downconverting receiver and the response of the downconverting receiver is removed to provide an accurate characterization of the modulated microwave signal. Such an accurate measurement of the modulated microwave signal can be used for communications system performance verification as well as for characterizing communications devices and systems. One particular application is the measurement of input/output characteristics of nonlinear power amplifiers using such modulated microwave signals.

16 Claims, 7 Drawing Sheets

BASEBAND TIME-DOMAIN TEST CONFIGURATION

BASEBAND TIME-DOMAIN TEST CONFIGURATION

BASEBAND TIME-DOMAIN TRANSMITTER

BASEBAND TIME-DOMAIN RECEIVER

MICROWAVE PULSE IN-PHASE MEASUREMENT

MICROWAVE PULSE QUADRATURE MEASUREMENT

TIME-DOMAIN PROCESSING ALGORITHM

Step 5
Resample waveforms to restrict to one period and the required number of points define: $R(n) = \left\lfloor \dfrac{nt_S}{T_S} \right\rfloor \quad (n = 0 \text{ to } N-1)$ $F(n) = \dfrac{nt_S}{T_S} - \left\lfloor \dfrac{nt_S}{T_S} \right\rfloor$ $\tilde{i}(n)$ = resampled I array
$\tilde{q}(n)$ = resampled Q array then:

$\tilde{i}(n) = I(R(n)) + F(n)[I(R(n)+1) - I(R(n))]$ $\tilde{q}(n) = Q(R(n)) + F(n)[Q(R(n)+1) - Q(r(n))]$

Step 6
Subtract out dc component $\tilde{i}_A(n) = \tilde{i}(n) - \dfrac{1}{N}\sum_{j=0}^{N-1} \tilde{i}(j)$ $\tilde{q}_A(n) = \tilde{q}(n) - \dfrac{1}{N}\sum_{j=0}^{N-1} \tilde{q}(j)$ Continue to Step 7

TIME-DOMAIN PROCESSING ALGORITHM

FIG. 5B

Step 7
Extend receiver transmission response to cover the same frequency range as discrete Fourier transform of the measured waveforms $$\omega^{ext}(l) = \frac{-\pi}{t_s} \text{ for } L = 0$$

$$= \omega^{meas}(0) - 2\pi \text{ for } L = 1$$

$$= \omega^{meas}(L-2) \text{ for } L = 2 \text{ to } M+1$$

$$= \omega^{meas}(M-1) + 2\pi \text{ for } L = M+2$$

$$= \frac{\pi}{t_s} \text{ for } L = M+3$$

then :

$$H^{ext}(\omega^{ext}(L)) = H^{meas}(\omega^{meas}(\lfloor \frac{M}{2} \rfloor)) \times 1000 \text{ for } L = 0,1$$

$$= H^{meas}(\omega^{meas}(L-2)) \text{ for } L = 2 \text{ to } M+1$$

$$= H(\omega^{meas}(\lfloor \frac{M}{2} \rfloor)) \times 1000 \text{ for } L = M+2, M+3$$

Step 8
Resample receiver transmission response to match discrete Fourier transform of measured waveforms $$\omega(k) = \frac{2\pi k}{Nt_s} \text{ for } k = 0 \text{ to } \frac{N}{2}$$

$$= \frac{2\pi k}{Nt_s} - \frac{2\pi}{t_s} \text{ for } k = \frac{N}{2} + 1 \text{ to } N-1$$

$$\tilde{H}(\omega(k)) = H^{ext}(\omega^{ext}(L-1)) + \frac{\omega(k) - \omega^{ext}(L-1)}{\omega^{ext}(L) - \omega^{ext}(L-1)} [H^{ext}(\omega^{ext}(L)) - H^{ext}(\omega^{ext}(L-1))];$$

$$k = 0, \ldots, N-1$$

and $L \varepsilon \{0, \ldots, M+3\}$ is such that $\omega^{ext}(L) \geq \omega(k) > \omega^{ext}(L-1)$ Continue to Step 9

TIME-DOMAN PROCESSING ALGORITHM
FIG. 5C

Step 9
Correct waveforms for receiver transmission response $$\tilde{v}(n) = \tilde{i}_A(n) + j\tilde{q}_A(n), \text{ where } j \text{ is } \sqrt{-1}$$

$$\tilde{V}(k) = \sum_{k=0}^{N-1} \tilde{v}(n) \exp\left(-j\frac{2\pi nk}{N}\right)$$

$$\tilde{V}_C(k) = \frac{\tilde{V}(k)}{\tilde{H}(\omega(k))}$$

$$\tilde{v}_C(n) = \frac{1}{N}\sum_{k=0}^{N-1} \tilde{V}_C(k) \exp\left(j\frac{2\pi nk}{N}\right)$$

$$\tilde{i}_C(n) = \text{Re}[\tilde{v}_C(n)]$$

$$\tilde{q}_C(n) = \text{Im}[\tilde{v}_C(n)]$$

Step 10
Normalize waveforms to measured RF signal power $$G_{RF} = \sqrt{\frac{NP_{\text{mod}} - NG_{DC}^2[(I_{DC}-I_o)^2 + (Q_{DC}-Q_o)^2]}{\sum_{n=0}^{N-1}(\tilde{i}_C^2(n) + \tilde{q}_C^2(n))}}$$

$$\tilde{i}_P(n) = G_{RF}\tilde{i}_C(n) - G_{DC}(I_{DC} - I_o)$$

$$\tilde{q}_P(n) = G_{RF}\tilde{q}_C(n) - G_{DC}(Q_{DC} - Q_o)$$

End

TIME-DOMAIN PROCESSING ALGORITHM

FIG. 5D

BASEBAND TIME-DOMAIN WAVEFORM MEASUREMENT METHOD

REFERENCE TO RELATED APPLICATION INCORPORATED BY REFERENCE

The present application is related to applicant's U.S. Patent entitled "Frequency Translating Device Transmission Response Method", U.S. Ser. No. 08/865,276, filed May 28, 1997, U.S. Pat. No. 5,937,006 issued Aug. 10, 1999, by the same inventors, which application is here incorporated by reference as there fully set forth.

STATEMENT OF GOVERNMENT INTEREST

The invention was made with Government support under contract No. F04701-93-C-0094 by the Department of the Air Force. The Government has certain rights in the invention.

FIELD OF THE INVENTION

The invention relates to the field of measurement methods of electronic signals and devices. More particularly, the invention relates to baseband time-domain measurement method of communications signals, such as modulated waveforms used in communication systems. Further still, the invention relates to methods for measuring the performance characteristics of nonlinear and linear devices used in communications systems such as power amplifiers used as transmitters.

BACKGROUND OF THE INVENTION

Modulated microwave signals are used to carry information in a wide variety of electronic communications systems. Examples include modulated microwave signals used to transmit voice and data or video signals from a ground transmitter through space to a satellite, and then back from the satellite to a ground receiver. Another example is a television transmitter, which transmits modulated signals that carry the picture and sound to television sets. Another example is a cellular base station, which transmits modulated microwave signals that carry the voice information to cellular phones. Such signals must be accurately measured for conformance to systems specifications and for accurate modeling of deviations from ideal performance.

It is also desirable to use such modulated microwave signals to characterize nonlinear devices, such as power amplifiers, used in communications systems, because these are the signals that the devices receive in operation. Nonlinear electronic devices are often the most difficult elements to model accurately in communications simulations. A recent example is the design and simulation of power amplifiers for use in digital cellular applications. In this case, the transmit power amplifier must be operated at or near saturation for high efficiency, and still meet stringent adjacent channel power requirements. This is an example where accurate, computationally efficient nonlinear models are required to make the proper design tradeoffs. Also known as black-box models, these models are computationally efficient because they transform an input waveform to the correct output waveform without resorting to the details of circuit operation. These models seek to characterize the nonlinear amplifier through the use of a selected set of probing signals. The degree of predictive fidelity of these simulation models must be checked with the class of operational signals expected, such as modulated microwave signals.

A prior procedure of measurement of modulated microwave signals is to record directly the radio frequency (RF) or microwave signal by means of a digital storage oscilloscope or other waveform recorder. For measurement of nonlinear devices, the RF or microwave frequency waveforms must be measured at the input and output of the device to find the input to output characteristic. These waveforms should be recorded at a number of input power levels throughout the operating range of the nonlinear device. Examples of such nonlinear components are a solid-state power amplifier or a traveling-wave tube amplifier. Time-domain instrumentation can record the waveform data digitally and store the data directly on a controlling computer.

Typical instruments used for recording waveform data are a digital storage oscilloscope (DSO), a microwave transition analyzer (MTA), or a recently developed nonlinear vector network analyzer (NVNA). The accuracy of these instruments for measuring high frequency signals is limited by linear amplitude and phase distortion. The MTA and high bandwidth DSO have significant phase and amplitude distortion beginning at frequencies above about 15.0 GHz. The NVNA is based on an MTA, but the NVNA comes with calibration standards and an extensive calibration routine so that phase and amplitude distortion, and other errors, are analytically removed from the measurements. The Hewlett-Packard NVNA performs calibrated time-domain measurements of signals up to 50.0 GHz. This NVNA includes calibration standards and software that calibrates the sampling oscilloscope for analog and digital nonlinearity, and gain and phase responses over a frequency range. Hence, the NVNA can provide accurate waveforms up to 50.0 GHz. The NVNA calibration eliminates any inaccuracy associated with the gain and phase response of the sampling oscilloscope, however, the NVNA still has limitations imposed by a limited number of samples and phase noise errors. The NVNA is a very complex and expensive system, however, and the calibration process is cumbersome. Additionally, the NVNA cannot be used to characterize a modulator providing an arbitrary microwave waveform.

Another prior waveform measurement approach is to use an uncalibrated downconverter with separate I and Q output signals. These I and Q output signals are then recorded by means of a DSO. This technique also yields the time-domain baseband waveform, but is corrupted by the undesired distortions of the downconverter, including the I/Q imbalance between the I and Q signals. The unknown distortions are usually large enough to render the waveform data useless for any precision application such as communications system modeling.

A recent measurement approach measures the transmission response of a frequency translating device (FTD), such as a mixer, as disclosed in the related patent. The response of the FTD, including a downconverter, may be measured by means of the baseband-double-sideband-mixer FTD characterization method, as described in the related patent. In this FTD characterization method, three pair wise combinations of an upconverter referred to herein as a transmitter, a test mixer, and the downconverter referred to herein as a receiver, are measured. The transmission response of the downconverting receiver is then calculated from these measurements. The test configuration setup for this FTD characterization method consists of connecting an upconverting transmitter FTD to a downconverting receiver FTD with both using the same local oscillator (LO) but with a phase shifter in the downconverter LO path. A vector network analyzer (VNA) is used to measure this first paired combination at two relative LO phase settings 90° apart. The additional test mixer is used in the second of these measurements as an upconverter and in the third of these measurements as a downconverter. The FTD characterization method requires that the test mixer have the same frequency response, that is a reciprocal frequency response, whether the test mixer is used as an upconverter or a downconverter. In practice, commonly available double-balanced mixers exhibit this reciprocal response if a low voltage standing wave ratio (VSWR) is provided on all ports by use of fixed attenuators. These six measurements, for the three configurations with zero and with ninety degree phase shift, are sufficient to extract the frequency response of all three FTDs, including the downconverting receiver. By mathematically combining the six measurements provided by the three-setup configuration, with and without the 90° phase shift, the lowpass equivalent (LPE) frequency response of the downconverting receiver may be obtained. This three-pair FTD characterization method has not been applied to the characterization of an arbitrary microwave signal. These and other disadvantages are solved or reduced using the invention.

SUMMARY OF THE INVENTION

An object of the invention is to provide a method for measuring the characteristics of nonlinear or linear devices.

Another object of the invention is to provide a method for characterizing nonlinear or linear devices at baseband.

Yet another object of the invention is to provide a method for measurement of an arbitrary repetitive modulated microwave signal.

The present invention is directed to a method for measuring modulated microwave signals in the time domain. Modulated microwave signals occur in many microwave communications systems. Measurement of such signals is useful for characterizing a device under test (DUT) that may have a nonlinear response. For characterizing an arbitrary microwave signal, an analyzer, such as a digital storage oscilloscope (DSO) or microwave transition analyzer (MTA) is coupled to a downconverting receiver having a known response. The downconverting receiver as a unit is a frequency translating device having a response that can be predetermined using an FTD characterization method described in a related patent. Then, an arbitrary microwave signal is applied as a microwave test signal to the downconverting receiver for downconverting the microwave signal to baseband for generating a lowpass equivalent (LPE) waveform having both in-phase and quadrature components that are then recorded by an analyzer such as a microwave transition analyzer (MTA) or a digital storage oscilloscope (DSO). The frequency response of the downconverting receiver is then analytically removed from the recorded waveforms for providing an accurate LPE representation of the original microwave test signal with improved accuracy and reduced noise of the measurements performed at baseband rather than at the local oscillator frequency, that is also referred to as, a signal carrier frequency. The time-domain measurement of the lowpass equivalent of the microwave signal provides a complete characterization of the test microwave signal, including both phase and amplitude information. Thus, time-domain measurements at the output of the downconverting receiver can be used to provide a complete characterization of the microwave test signal. The microwave test signal may then be applied to a device under test (DUT) which in turn is connected to the downconverting receiver. The DUT may be a nonlinear microwave device, such as a power amplifier or a linear device such as a filter.

The response of the DUT is measured by sampling the output of the downconverting receiver. This sampling is accomplished by the analyzer. The characterized response of the FTD downconverter is then removed from the DUT output waveform measurement to provide characterization of the DUT in the presence of the characterized test microwave signal. This new baseband time-domain waveform measurement technique makes possible characterization of a DUT or arbitrary modulator microwave signals at any local oscillator frequency that can be generated. Microwave signals at frequencies far above the 50.0 GHz limit of the NVNA can thus be measured.

The method measures microwave signals in the time domain but does not suffer the accuracy and noise limitations of measurements performed directly at the local oscillator frequency. Accurate lowpass equivalent waveforms are obtained after correcting for the downconverting receiver response using the baseband-double-sideband frequency-translating-device characterization method. These LPE waveforms provide a complete characterization of the microwave test signal, including both phase and amplitude information. The method is particularly useful in the characterization of nonlinear devices for the purposes of model generation and verification, and useful for characterization of microwave waveforms such as those generated by an arbitrary communication system transmitter or modulator.

The baseband time domain measurement method can be used to characterize a wide variety of microwave devices, components, and even entire communication systems providing an arbitrary microwave signal. This characterization data may be used in a design specification for a communication system, for assessing the performance of communication system components, and for system and component simulation model generation and validation. The time-domain waveforms provide a means of fully characterizing both linear and nonlinear devices. Properly chosen microwave test waveforms and the resulting measured lowpass-equivalent waveforms contain all the required information to fully characterize a device under test over the frequency bandwidth of the input microwave test waveform. A time-domain measurement of a microwave signal provides a complete characterization of that signal, including both phase and amplitude information. Typical waveforms are short radio frequency (RF) or microwave pulses, as well as digitally-modulated signals. The waveform chosen is preferably repetitive because digital recording instrumentation typically have a narrow real-time bandwidth, and use precise time incrementing to achieve a high equivalent bandwidth, and the sampling rate of the recording instrument is typically not high enough to capture the microwave waveform in real time.

The new baseband time domain measurement technique provides precise and accurate measurements of microwave signals. The method directly records the low-pass equivalent waveforms used in simulation by converting the signals to baseband with a calibrated downconverting receiver before the waveform is captured by a DSO or MTA. The LPE signals are related to the original signals by a mathematical transformation with no loss of information. The LPE signals have both an in-phase and a quadrature component, thus two waveform measurements are required.

Measuring signals at baseband has several advantages compared to measuring them directly at the local oscillator frequency. One advantage is that the sample rate can be reduced by the ratio of half the signal bandwidth to the carrier frequency, thereby allowing for a longer time record or higher time resolution of the signal for the same number of samples and enable the use of LPE test signals in modeling. Another advantage is that the phase noise of the carrier is eliminated because the downconverter uses a local oscillator coherent with a carrier used to generate the microwave test signal. Also, with an appropriate downconverter, measurements can be done at the local oscillator frequencies through the millimeter wave range where direct measurement using the MTA or DSO would be impossible, or at best, inaccurate.

The basic measurement system consists of a downconverting receiver followed by an analyzer such as an MTA or DSO. The DC level at baseband, which corresponds to the component of the signal at the carrier frequency, is measured separately by means of a bias tee and a volt meter at the output of the downconverter when a baseband amplifier in the receiver blocks the DC component. A digital storage oscilloscope could be used in place of the MTA, but the MTA has advantages such as an extensive internal calibration routine and the capability of locking to an external 10-MHz reference.

The microwave test signal to be measured can have any arbitrary repetitive phase or amplitude modulation and is at a carrier frequency established by the unmodulated local oscillator signal that also feeds the LO input of the downconverting receiver. The local oscillator has two coherent LO outputs, a fixed phase LO signal and a variable phase LO signal. The fixed-phase LO signal is used by an upconverting transmitter that modulates the LO. The upconverting transmitter provides the microwave test signal that is characterized and is used as an excitation of the device under test. The LO signals are also used for the calibration procedure. The stability requirements on the local oscillator need not be high, because the local oscillator phase noise is canceled by the downconversion. The baseband microwave test signal, however, should be very stable, with a reference output, such as a 10.0 MHz reference output for use by the analyzer (MTA or DSO) as an external reference. The modulating source should also have a trigger output that can be used to trigger the analyzer synchronously at the repetition frequency of the modulation.

The transmitter includes an upconverter used with the coherent LO. A baseband waveform synthesizer can be used to provide an arbitrary modulation to the upconverting transmitter. Various microwave amplifiers and variable attenuators are provided to allow the input power to the device under test to be adjusted over a suitable operating range. These and other advantages will become more apparent from the following detailed description of the preferred embodiment.

BRIEF DESCRIPTION OF THE DRAWINGS

FIGS. 5A through 5D are a flow chart of the time domain processing algorithm.

DETAILED DESCRIPTION OF THE PREFERRED EMBODIMENT

Figure 1:
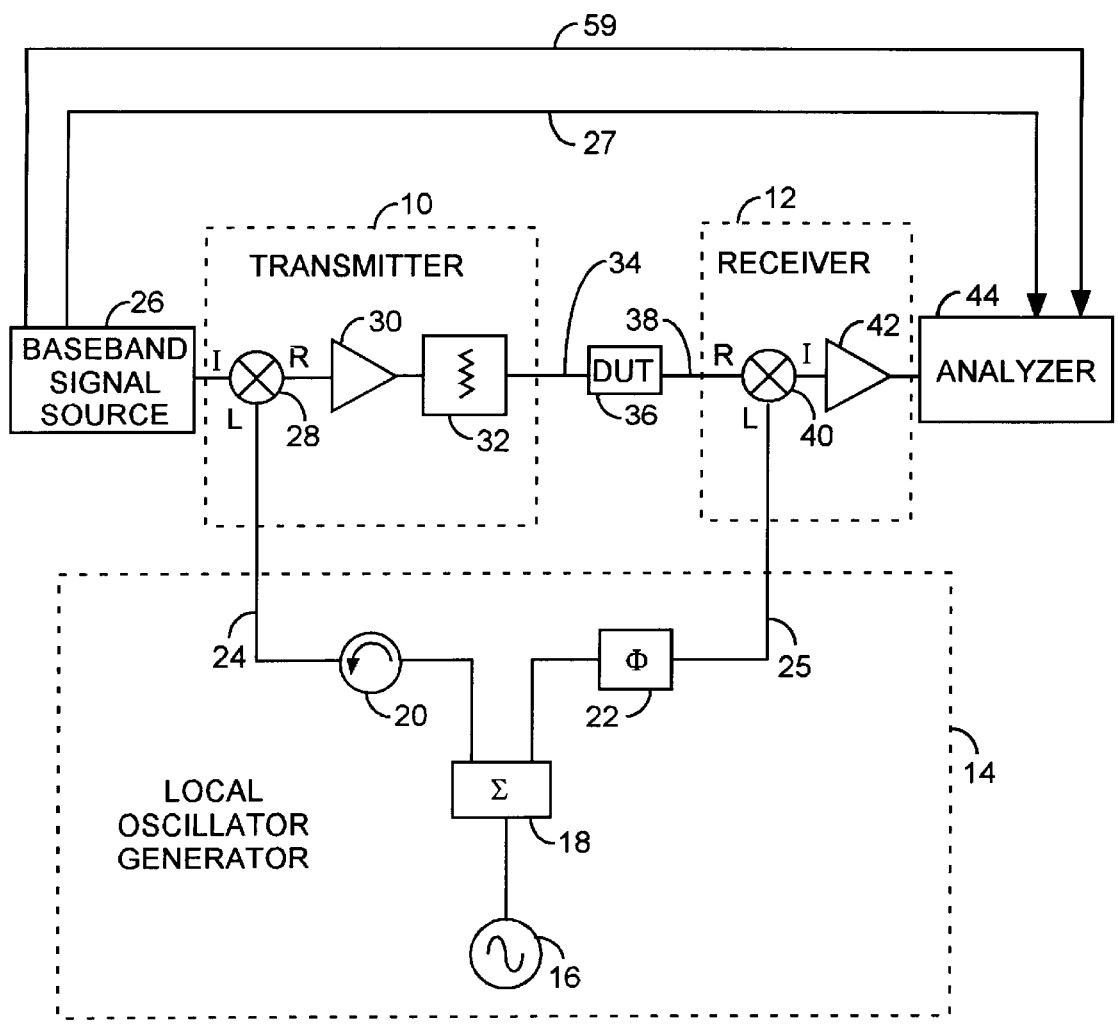
FIG. 1 is block diagram of a baseband time-domain test configuration.
Figure 2:
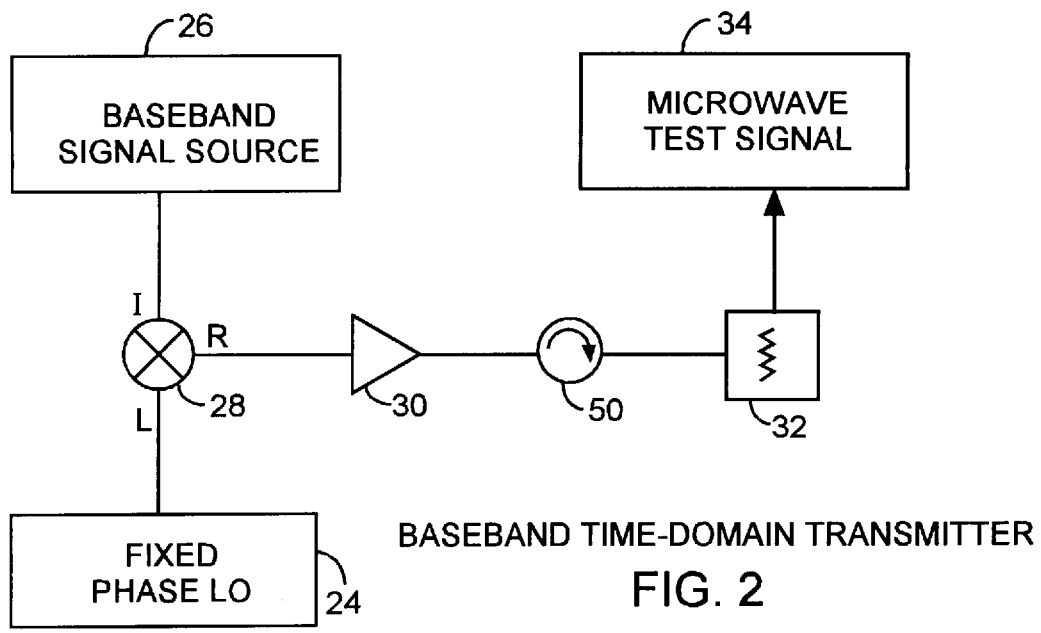
FIG. 2 is a detailed block diagram of an upconverting transmitter used in the test configuration.
Figure 3:
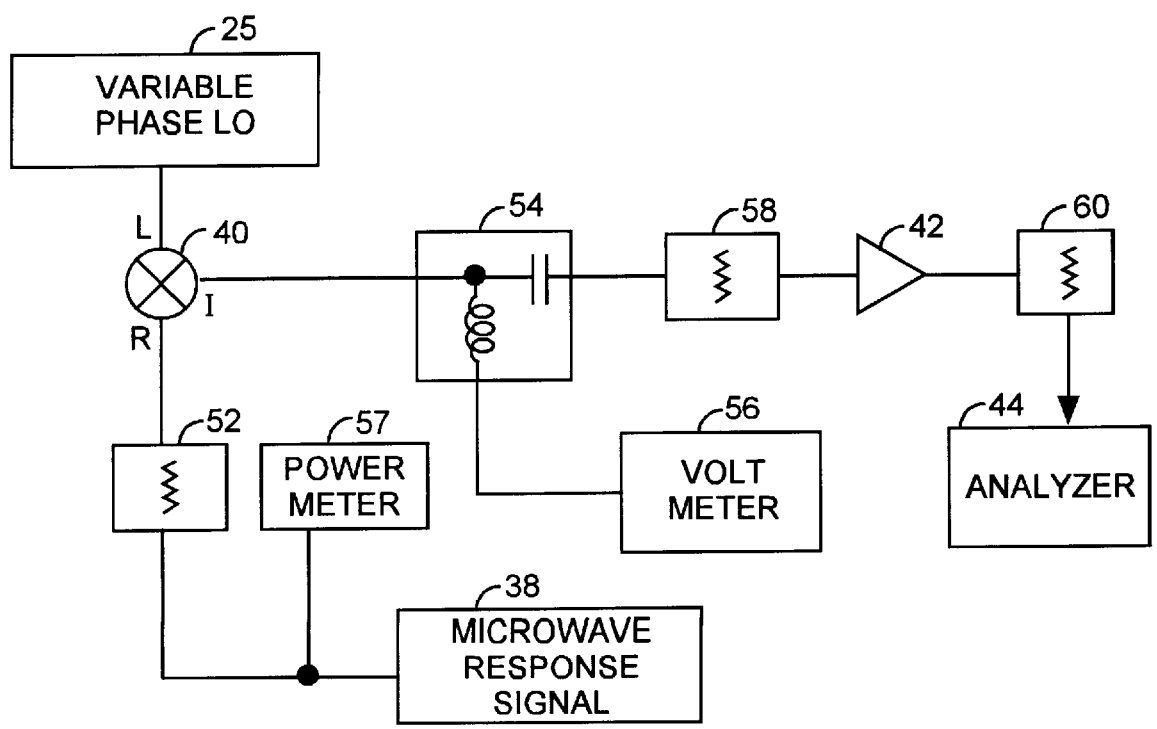
FIG. 3 is a detailed block diagram of a downconverting receiver used in the test configuration.

An embodiment of the invention is described with reference to the figures using reference designations as shown in the figures. Referring to FIGS. 1, 2 and 3, the baseband time-domain basic measurement test configuration system consists of an upconverting transmitter 10 and a downconverting receiver 12, both driven by a local oscillator generator 14, for measuring baseband waveforms. The oscillator generator 14 includes a local oscillator (LO) 16, a splitter 18 providing a local oscillator signal to an isolator 20 and phase shifter 22. The isolator 20 provides a fixed phase local oscillator signal 24 that may be considered as a carrier signal. The phase shifter 22 provides a variable phase local oscillator signal 25 that is used for coherent downconversion. In a broad form, the preferred transmitter 10 is driven by a baseband signal source 26 for providing a baseband test signal to the transmitter 10 and for providing a 10 MHz reference signal 27 and a trigger signal 59. The transmitter 10 includes an upconverter 28, microwave amplifier 30 and attenuator 32. The baseband signal source 26 provides the baseband test signal that drives the upconverter 28 receiving the fixed phase LO signal 24 for providing an upconverted signal to the microwave amplifier 30 that in turn drives the attenuator 32 providing a microwave test signal 34. When testing a device under test (DUT) 36, the microwave test signal is applied directly to the DUT 36 providing a microwave response signal 38. When characterizing an arbitrary microwave test signal, such as the microwave test signal 34, the microwave test signal 34 becomes a microwave test signal 38 applied directly to the receiver 12. Hence, the transmitter 10 can be any arbitrary system providing an arbitrary repetitive modulated microwave test signal 34. In the broad form of the invention, the microwave test signal 34 is the microwave test signal 38 connected directly to the receiver 12 for characterization of the microwave test signal 34 and 38 without characterizing the DUT 36 with the DUT 36 effectively removed as a short circuit having no responsive characteristics.

In preferred form, the DUT 36 is inserted between the transmitter 10 and receiver 12. The receiver 12 includes a downconverter 40 and a baseband amplifier 42. When excited by the microwave test signal 34, the inserted DUT 36 provides a microwave response signal 38 to a downconverter 40 that also receives the variable phase LO signal 25 and provides a downconverted signal to the baseband amplifier 42 that in turn provides a baseband response signal that is recorded by an analyzer 44. The microwave signals 34 and 38 of the DUT to be measured can have any arbitrary repetitive phase or amplitude modulation, but the microwave signals 34 and 38 must be accompanied by unmodulated LO signals 24 and 25 to respective upconverter 28 and downconverter 40 of transmitter 10 and receiver 12, respectively. The trigger signal 59 must also be supplied to analyzer 44, while the reference signal 27 is optional. The transmitter 10 and receiver 12 operate respectively using the fixed phase LO signal 24 and the variable phase LO signal 25, which are coherent LO signals. These coherent LO signals 24 and 25 are used during testing and calibration procedures. The analyzer 44 is preferably a microwave transition analyzer (MTA), but could also be a digital storage oscilloscope (DSO) used in place of the MTA with reduced accuracy, because most DSOs do not have the calibrated accuracy of an MTA. Referring to FIG. 2, the transmitter 10 may further include an isolator 50 connected between the microwave amplifier 30 and attenuator 32. Referring to FIG. 3, the downconverting receiver 12 may further include a bias tee coupler 54 for providing a voltage signal to a volt meter 56. A power meter 57 is used to measure the power of the microwave test signal, from the transmitter 10, or the microwave response signal 38 when the DUT 36 is inserted.

The receiver 12 may further include attenuators 58 and 60 for impedance matching. The DC level of the downconverted signal from the downconverter 40 is separated from the LPE signal by the bias tee 54 and corresponds to the Fourier component at the LO frequency. The DC level that is separated by the bias tee 54 is measured by the volt meter 56 at the output of the downconverter 40 that may also be a mixer. The measurement of the DC level is preferred because the baseband amplifier 42 blocks the DC component of the baseband response signal from the downconverter 40. The frequency stability requirements on the local oscillator signals 24 and 25 from oscillator 16 need not be high because the phase noise is canceled by downconversion in the receiver 12. The baseband modulation signal provided to the upconverter 28, which is a mixer 28, however, must be stable, preferably with a 10.0 MHz reference output 27 to be used by the MTA 44 as an external reference. The modulating baseband source 26 must also be used to trigger the MTA 44 using trigger signal 59.

The method is used to characterize microwave test signals 34 and/or a DUT 36. Firstly, the frequency response of the downconverting receiver 12, including the downconverter 40 is determined. The downconverter 40 is a frequency translating device. The downconverting receiver frequency response is determined using the known frequency translation device characterization method of the related patent. Secondly, a microwave test signal 34 is generated and applied directly to the downconverting receiver 12. The downconverted baseband signal from the amplifier 42 is then recorded by the analyzer 44, where the phase shifter, 22, is at a known setting designated as 0 degrees to record the uncorrected in-phase component of the LPE signal of the baseband signal with the DUT inserted. The phase shifter 22 is then adjusted by ninety degrees to a setting designated as ninety degrees and the downconverted baseband signal is again recorded to form the uncorrected quadrature component of the LPE signal. The in-phase and quadrature waveforms are recorded at the 0° and 90° phase settings respectively. In the preferred form, the DC voltage is also recorded at the same two phase settings by means of the volt meter 56 to produce the DC component of the LPE waveforms. Alternatively, the DC measurement performed by means of the volt meter 56 may be recorded at four phase settings, 0°, 90°, 180°, and 270° in order to more effectively cancel DC mixer offsets. In this instance, the DC component at 0° and the inverse of the DC component at 180° are combined to form the in-phase DC component, and the DC component at 90° and the inverse of the DC component at 270° are combined to form the quadrature DC component. The LPE signals from the amplifier 42 includes the frequency response of the entire downconverting receiver 12 and are therefore uncorrected, in view of the microwave test signal 34. To obtain corrected LPE signals, the frequency response of the downconverting receiver 12 is removed. The correction procedure is required to remove the receiver frequency response from the baseband test signal. Thirdly, the DUT is inserted between the transmitter 10 and receiver 12, and the microwave test signal 34 is applied to the DUT providing the microwave response signal 38 to the downconverting receiver 12. The microwave response signal 38 is measured in the identical way as the microwave test signal was measured as described immediately above. That is, the analyzer 44 records the downconverted, baseband in-phase and quadrature waveforms at the two phase shifter settings, 0 degrees and 90 degrees respectively, and the voltmeter 56 measures the DC component of the baseband signal at the same two phase shifter settings. These waveforms are then corrected for the downconverting receiver frequency response to obtain the corrected characterization of the microwave response signal 38. The input signal 34 of the DUT and the output signal 38 of the DUT have thus been obtained so that the input-output characteristics of the DUT is recorded. Hence, the method is a three part method that includes firstly the characterization of the receiver 12 comprising the downconverter 40 and amplifier 42, a characterization of the microwave test signal 34 and a characterization of the microwave response signal 38. The characterization of the microwave test signal 34 and of the microwave response signal 38 together constitute the characterization of the input-output response of the DUT.

In the special case where the DUT is linear, the frequency response of the DUT may be determined directly from the uncorrected LPE test signal and the uncorrected LPE response signal. In this case, the corrected LPE test signal or the corrected LPE response signal need not be calculated. This is because the linear DUT frequency response is equal to the discrete Fourier transform of the uncorrected LPE response signal divided by the discrete Fourier transform of the uncorrected LPE test signal.

The transmitter 10 provides the microwave test signal 34 to the DUT 36 or to the receiver 12 to produce the baseband LPE waveform that is recorded by the MTA 44. At the same time, the DC component at the phase shifter setting is recorded, scaled to take into account the gain of the baseband amplifier 42, and added to the baseband LPE waveform. The phase shifter 22 is then adjusted by 90° and the downconverted baseband signal and the corresponding DC component are again recorded and combined to yield the uncorrected quadrature component of the LPE signal. Enhanced measurement accuracy of the Fourier component at DC is provided by performing a zeroing procedure consisting of another DC measurement at both phase settings with no microwave test signal input and subtracting the DC values thus obtained from the measurements with the microwave test signal applied. This zeroing procedure may be applied periodically to eliminate drift. If the ultimate DC component accuracy is required, measurements at four phase settings 90° apart may used to provide enhanced cancellation of DC mixer offsets. The 0° and the inverse of the 180° measurements are combined to form the in-phase component, and the 90° and the inverse of the 270° measurements are combined to form the quadrature component. This procedure eliminates any drift that can occur during the time interval between the DC zeroing procedure and the time at which the baseband waveform data is recorded. Because the same downconverting receiver 12 is used to measure both the I and the Q waveforms, there is no I/Q imbalance. The LPE signals thus obtained include the frequency response of the receiver 12 and are therefore uncorrected. To obtain corrected LPE signals, the frequency response of the receiver 12 must be removed. The response of the receiver 12 is removed analytically from the uncorrected signals by means of the prior baseband-double-sideband frequency translating device FTD characterization method. The receiver response may then be removed analytically from the uncorrected LPE signal measurements, leaving an accurate LPE representation of the microwave test signal.

Among the signals that can be recorded are input microwave test signal 34 with the DUT 36 removed, and the output microwave response signal 38 of a nonlinear device under test 36 when inserted and excited by the input microwave test signal 34. The transmitter 10 and the receiver 12 are connected together to record the input LPE signal, that is the microwave test signal 34, and then the microwave response signal 38 of the DUT 36 when inserted between the transmitter 10 and the receiver 12 to record the microwave response signal 38 as an output LPE signal. The broad form of the method is to record the output waveforms of an arbitrary microwave frequency modulator 10. These time-domain measurements can then be used to optimize and validate simulation models of arbitrary modulators 10 and/or DUTs 36. To enhance the usefulness of the time-domain measurement system, the upconverting transmitter 10 is used with the coherent LO generator 16 and a baseband waveform source 26 to provide modulated microwave test signals 34. The microwave amplifier 30 and variable attenuator 32 enable the input power to the DUT 36 to be adjusted over an predetermined operating range. Once the uncorrected baseband signals are measured with the DUT 36 inserted between the transmitter 10 and receiver 12, the receiver frequency response are analytically removed. Although any modulated microwave test signal 34 may be used, for example, a 0.35-ns wide, 0.5 V amplitude baseband pulse generated by source 26 may be used as a modulation input to the upconverter 28. The LO frequency of signals 24 and 25 may be for this example, 19.6 GHz. The transmitted pulse can be measured using the baseband time-domain measurement method and the receiver response correction then applied. As a validation of the time-domain baseband method, the same microwave test signal 34 is measured directly at 19.6 GHz using the MTA without the DUT 36 or downconverting receiver 12 inserted.

Figure 4A:
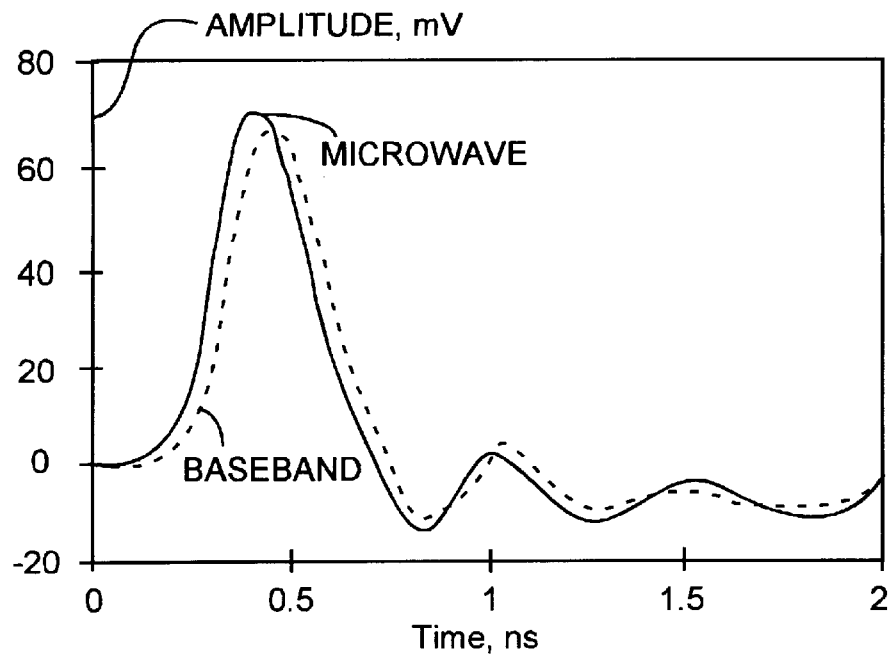
FIG. 4A is a graph of a microwave pulse in-phase test signal measurement.
Figure 4B:
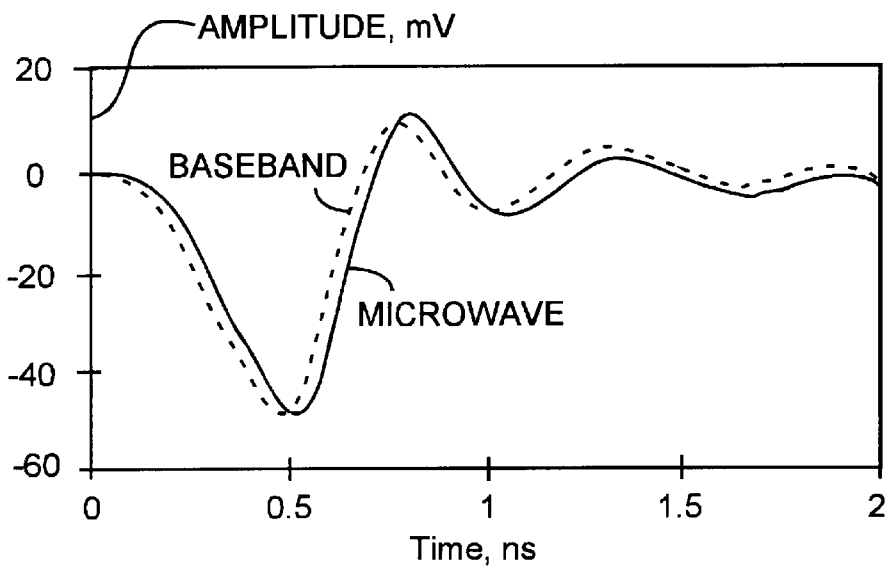
FIG. 4B is a graph of a microwave pulse quadrature test signal measurement.
Figure 5A:
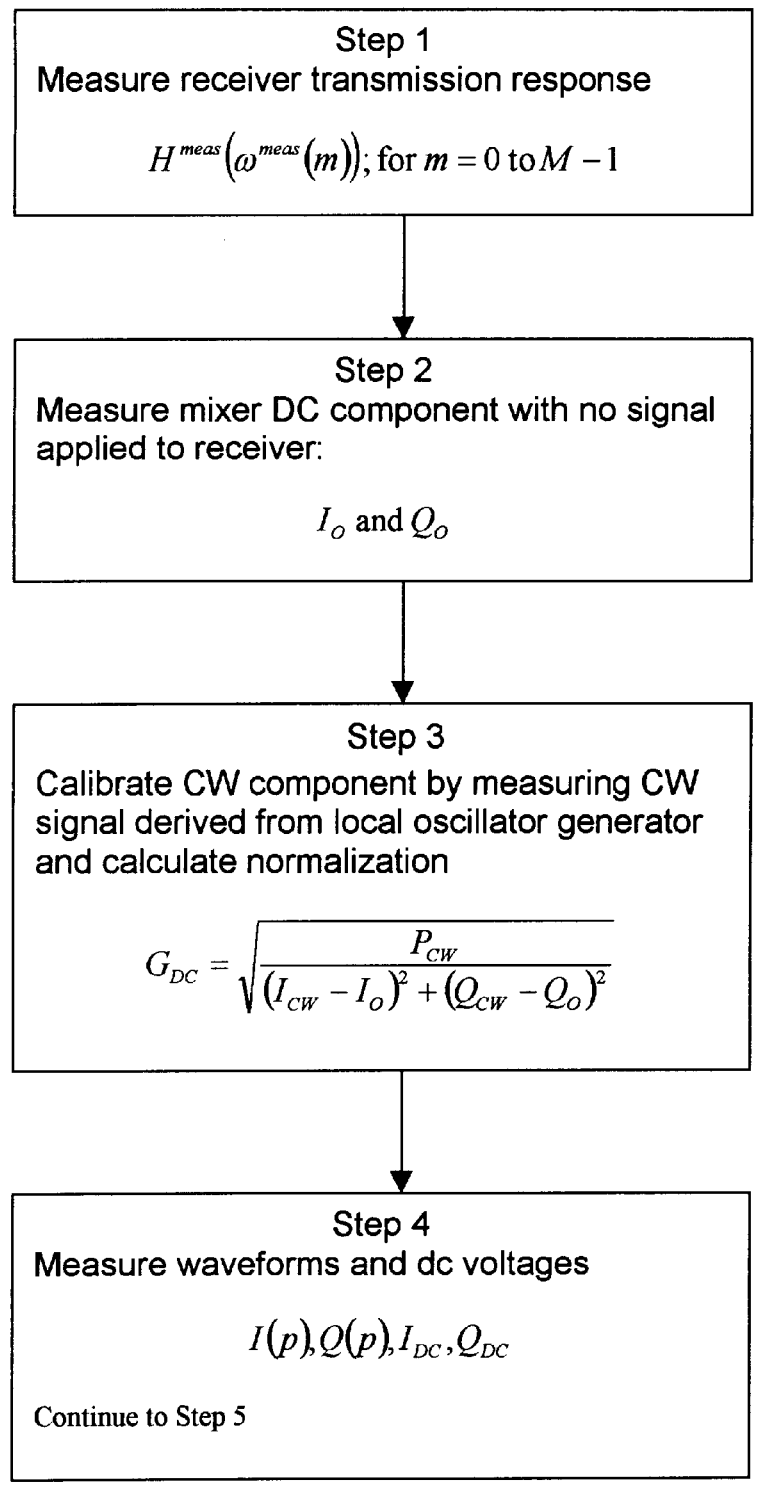

Referring to all of the Figures, and more particularly to FIGS. 4a and 4b, the signal envelope of both a corrected baseband measurement and a direct microwave measurement of a microwave pulse at 19.6 GHz are shown. The direct microwave measurement without the DUT 36 or receiver 12 was recorded by analyzer 44 and then downconverted to baseband in software. The agreement between the corrected baseband and the direct microwave measurement indicates the validity of the time-domain baseband measurement method. This comparison illustrates the consistency of the time-domain baseband method with the direct measurement. The time-domain baseband method may be applied to situations where the direct microwave measurement is inadequate, for example where the LO frequency is beyond the range of the analyzer 44, or the phase noise is too high, or the repetition period of the signal is too long to allow Nyquist sampling of the signal at the LO frequency given the limited number of samples available for example, 1024 samples for the MTA.

Measuring signals at baseband has several advantages compared to measuring them directly at the LO frequency. One advantage is that the sample rate can be reduced by the ratio of half the signal bandwidth to the LO frequency, thereby allowing for a longer time record or higher time resolution of the signal for the same number of samples. Another advantage is that the time base accuracy and stability requirements for the analyzer 44 (DSO or MTA) are reduced by the same ratio of half the signal bandwidth to the carrier frequency. Yet another advantage is that the phase noise of the carrier is eliminated because the same LO is used for both the upconversion and the downconversion. Finally, the MTA or DSO has a flatter frequency response at baseband than at high LO frequencies. For example, signals with a 4.0 GHz bandwidth require only 2.0 GHz at baseband, over which the MTA has a gain variation of only +/−0.1 dB. The phase deviation from linearity can be as high as 40° for a typical digitizing oscilloscope at 20.0 GHz, but it is negligible below 5.0 GHz.

FIGS. 4A and 4B show an example of time-domain measurements of a sub-nanosecond amplitude pulse. This waveform was generated by applying a 0.35-ns width, +0.2-V amplitude baseband pulse to the upconverting transmitter shown in FIG. 3, using an LO frequency of 19.6 GHz. This signal was measured by means of the baseband-time-domain measurement method where the waveform recording instrument was an MTA. The same signal was also measured directly at the 19.6 GHz carrier frequency also using the MTA with a sampling frequency of four samples per cycle of the carrier frequency. The prior art direct microwave measurement was then downconverted in software to baseband for comparison with the time-domain baseband measurement method. The in-phase and quadrature waveforms generated by the two methods are compared as shown in FIG. 4. The excellent agreement indicates the consistency of the two measurement techniques. The response of the MTA has not been removed from the data shown. The increased amplitude and phase distortion of the MTA in the direct microwave measurement may account for the slight differences between the results of the two methods.

The baseband time domain measurement method preferably uses the FTD measurement method to first measure the response of the downconverting receiver 12 to then be able to remove the distortion of the downconverting receiver in baseband time-domain measurements. The use of the same downconverting mixer FTD 40 with a phase-shifted LO eliminates I/Q imbalance in the measured complex baseband waveform. The four LO phases, 90° apart, are used to remove mixer DC offsets in the time-domain data, and used in calibration of the mixer offsets by measuring the DC output of the downconverter 40 with no signal input to achieve additional accuracy enhancement.

Referring to FIGS. 5A–5D, the time-domain baseband method preferably uses a detailed processing algorithm as a process for measuring the time-domain response of the DUT in ten steps.

Step 1 measures the transmission response of the receiver 12 by means of the single-sideband frequency translating device measurement method or the double-sideband frequency translating device measurement method as taught in the related patent. Step 1 provides the lowpass equivalent response of the downconverter 40. This method has, as an output, the transmission response of the receiver $H^{meas}(\omega^{meas}(m))$. This transmission response will be used in subsequent steps to remove the receiver distortion from the time domain baseband waveforms.

Steps 2 and 3 are required to obtain accurate calibrated measurements of a Fourier component of the signals at the local oscillator generator frequency. This Fourier component is at the local oscillator frequency at the microwave signal input 38 to the receiver 12. This Fourier component at the local oscillator generator frequency is downconverted to baseband by the mixer 40 and the downconverted baseband signal is provided at the intermediate frequency output of the mixer 40. The Fourier signal component appears as a DC voltage. The DC voltage is separated from the other signal components of the baseband signal by the bias tee 54, and this DC voltage is then measured by the voltmeter 56.

Step 2 measures the DC voltage by means of the voltmeter 56, with no signal input to the receiver at input 38. The DC voltage is measured and recorded at two settings of the phase shifter 22. The two phase shifter settings must be 90 degrees apart at the local oscillator frequency. Io is the voltage at the 0° setting and Qo is the voltage at the 90 degree setting.

Step 3 measures the DC voltage by means of the voltmeter 56, with the fixed phase LO signal 24 considered a continuous wave (CW) signal 24 used as a calibration signal 24 from the local oscillator generator 16, and injected directly into the receiver at input 38. The power in this continuous wave signal 24 and 38 is measured by means of a power meter 57, and recorded as Pcw. The DC voltage is measured and recorded at two settings of the phase shifter 22. The two phase shifter settings are 90 degrees apart at the local oscillator frequency, and are the same settings used in step 2. Icw is the voltage at the 0 degree setting and Qcw is the voltage at the 90 degree setting. The DC gain factor, Gdc, can then be calculated. This gain factor can then be used as a correction factor to obtain calibrated waveforms of other signals. Gdc is used for this purpose in Step 10.

Step 4 applies a modulated waveform as the microwave test signal 34, generated, for example by means of the baseband time-domain transmitter 10 and communicated to the receiver 12 at input 38 in a test configuration. The baseband signal waveform is recorded by means of an analyzer (DSO or MTA) 44, and the DC voltage is also recorded by means of voltmeter 56. Both the baseband waveform and the voltage are measured and recorded at two settings of the phase shifter 22. The baseband waveform record should extend over more than one period of the periodic input microwave test signal 34 and 38. The two phase shifter settings are 90° apart at the local oscillator frequency, and have the same two settings used in step 2. Idc is the voltage at the 0° setting and Qdc is the voltage at the 90° setting, while I(p) is the baseband waveform at the 0° setting, and Q(p) is the baseband waveform at the 90° setting. The time spacing between samples in the baseband waveforms I(p) and Q(p) is defined as Ts.

Step 5 resamples the baseband waveforms I(p) and Q(p) using linear interpolation. Other forms of interpolation could be applied such as using the sinc function, but the linear interpolation is adequate in most cases. The resampling should be done to achieve the desired number of samples, N, which should be an even number, and is preferentially a power of 2, such as 1024, for ease of subsequent discrete Fourier transforms. The desired resampling interval, ts, is chosen such that Nts=Tp, where Tp is one period of the periodic input signal. With these definitions, the formulas in step 4 are applied with inputs, I(p), Q(p), Ts, N, and ts. The outputs are $\tilde{i}(n)$ and $\tilde{q}(n)$ and are the resampled baseband waveforms.

Step 6 subtracts the DC component from the resampled baseband waveforms. If all instruments were working perfectly, there would be no DC component to remove because the bias tee 54 physically separates the DC component from the rest of the baseband signal that is recorded by analyzer 44. Step 6 ensures that DC offsets in the baseband amplifier 42 and analyzer 44 are removed. The true DC component of the baseband signal will be added back into the baseband waveform in step 10. The inputs for step 10 are the resampled waveforms $\tilde{i}(n)$ and $\tilde{q}(n)$ and the outputs are the baseband waveforms $\tilde{i}_A(n)$ and $\tilde{q}_A(n)$ that are identical to the resampled waveforms $\tilde{i}(n)$ and $\tilde{q}(n)$ except that the DC component has been subtracted out.

Step 7 extends the frequency range of the receiver transmission response to cover at least as great a frequency range as that covered by the discrete Fourier transforms of the resampled waveforms. The lowpass equivalent receiver transmission response was obtained in step 1. This measured receiver transmission response is defined as $H^{meas}(\omega^{meas}(m))$, where the measurement extends over M frequencies from $\omega^{meas}(0)$ to $\omega^{meas}(M-1)$. The measured receiver transmission response is extended to $\omega=-\pi/ts$ in the negative frequency range, and to $\omega=+\pi/ts$ in the positive frequency range to cover the Nyquist frequencies of the resampled voltage waveforms. Because there is no measured information about the receiver response outside the frequency range of $\omega^{meas}(0)$ to $\omega^{meas}(M-1)$, the extension is done by setting $H^{ext}(\omega^{ext}(L))$ equal to a large value for frequencies outside the measured range. Because the inverse of $H^{ext}(\omega^{ext}(L))$ is used in step 7 calculations, making $H^{ext}(\omega^{ext}(L))$ large outside the measured range of frequencies removes those frequencies from the final corrected waveforms. The inputs for this step 7 are the measured receiver response $H^{meas}(\omega^{meas}(M))$, and the resampled waveform sampling time interval ts. The output is the receiver response extended in frequency $H^{ext}(\omega^{ext}(L))$.

Step 8 resamples in the frequency domain, the extended receiver response $H^{ext}(\omega^{ext}(L))$ to exactly match the discrete Fourier transform of the baseband waveforms. A discrete Fourier transform of a baseband waveform having N samples with a sampling interval ts, has frequency components given by $\omega(k)$ in step 8. The equation in this step 8 is a linear interpolation of the receiver response $H^{ext}(\omega^{ext}(L))$ to match the frequencies $\omega(k)$. The inputs to this step 8 are the waveform sampling interval, ts, the number of waveform samples N, and the extended receiver response $H^{ext}(\omega^{ext}(L))$. The outputs are the discrete Fourier transform frequencies $\omega(k)$, and the extended and resampled receiver response $\tilde{H}(\omega(k))$.

Step 9 corrects the baseband waveforms $\tilde{i}_A(n)$ and $\tilde{q}_A(n)$ for the receiver response. The baseband waveforms are first transformed into the frequency domain using the discrete Fourier transform. Then the complex Fourier coefficients are corrected for the receiver response by dividing by the extended and resampled receiver response. Then the corrected frequency domain signal is transformed back into the time domain and the real and imaginary parts are extracted. The inputs for this step 9 are the resampled waveforms $\tilde{i}_A(n)$ and $\tilde{q}_A(n)$ and the extended and resampled receiver response $\tilde{H}(\omega(k))$. The outputs of this step 9 are the real and imaginary parts of the corrected baseband waveforms $\tilde{i}_c(n)$ and $\tilde{q}_c(n)$.

Step 10 normalizes the corrected baseband waveforms in power as measured by means of a power meter. The measured signal power is defined as Pmod. The RF normalization factor, Grf is first calculated. The normalized waveform is then obtained using Gdc from step 3 and Grf. The inputs are Pmod, Gdc, Idc, Gdc, N, Io, Qo, $\tilde{i}_A(n)$ and $\tilde{q}_A(n)$. The outputs are the normalization factor Grf, and the corrected and normalized real and imaginary waveforms $\tilde{i}_P(n)$ and $\tilde{q}_P(n)$. $\tilde{i}_P(n)$ and $\tilde{q}_P(n)$ are respectively the in-phase and quadrature components of the LPE waveform of the microwave test signal 34. To measure the microwave response signal 38, the DUT must be inserted between the transmitter 10 and receiver 12 with the test signal 34 input to the DUT and the DUT output connected to the receiver 12. Then steps 4 through 10 need to be repeated. Steps 1 through 3 do not need to be repeated because they are calibration steps, and the calibration will be good for a few hours.

The above method is useful for characterization of arbitrary microwave signals 34 and nonlinear DUT devices 36. The method involves firstly characterizing the response of a downconverting receiver 12 comprising a downconverter using the prior FTD characterization method. Secondly, the method is used to characterize an arbitrary test signal 34, by removing the response of the receiver 12 from a sampled measurement. Thirdly, the method is used to characterize a DUT 36 by measuring the input and output LPE waveforms and removing the response of the downconverting receiver 12 from the LPE waveforms. The method can be applied to a wide range of arbitrary microwave signals 34 and test devices 36. Those skilled in the art can make enhancements, improvements, and modifications to the invention, and these enhancements, improvements, and modifications may nonetheless fall within the spirit and scope of the following claims.

What is claimed is:

1. A method of determining a low pass equivalent of an input signal, the method comprising the steps of, determining a downconverter frequency response for a downconverting frequency translation device, receiving the input signal by the downconverting frequency translation device, downconverting the input signal into a baseband signal by the downconverting frequency translation device, measuring the baseband signal, and calculating the low pass equivalent of the input signal by analytically removing the downconverter frequency response from the baseband signal.

2. The method of claim 1 wherein the determining step is a three pair measurement method where the downconverting frequency translation device is one of three frequency translation devices one of which has a reciprocal frequency response, the three frequency translation devices are measured as coupled upconverter and downconverter pairs providing three measured responses for calculating the downconverter frequency response of the downconverting frequency translation device.

3. The method of claim 1 wherein the input signal is a microwave test signal.

4. The method of claim 1 wherein the input signal is a microwave response signal of a device excited by a microwave test signal.

5. The method of claim 1 wherein the downconverter frequency response is a phase and amplitude response over a frequency band.

6. The method of claim 1, wherein the baseband signal comprises an in phase baseband signal and a quadrature phase baseband signal, the method further comprising the steps of, providing a zero degree local oscillator signal to the downconverting frequency translation device for translating the input signal into the in phase baseband signal, and providing a ninety degree local oscillator signal to the downconverting frequency translation device for translating the input signal into the quadrature phase baseband signal, the low pass equivalent is calculated from the in phase and quadrature phase baseband signals.

7. The method of claim 6, wherein, the power in the input signal is measured by means of a power meter, and the in phase and quadrature phase baseband signals are multiplied by a constant to give the same power in the waveform as measured by the power meter.

8. The method of the claim 6 further comprises the steps of, applying in turn a zero and ninety degree phase shifted local oscillator signal to the downconverting frequency translation device to respectively provide zero and ninety degree phase shifted test DC signals, measuring zero and ninety degree phase shifted test DC signals for the downconverting frequency translation device, removing the input signal, applying in turn a zero and ninety degree phase shifted local oscillator signal to the downconverting frequency translation device to respectively provide zero and ninety degree phase shifted null DC offset signals with the input signal removed, measuring the zero and ninety degree phase shifted null DC offset signals with the input signal removed, subtracting respectively the zero and ninety degree phase shifted null DC offset signals from the zero and ninety degree phase shifted test DC signals for respectively providing an in phase test delta DC signal and a quadrature phase test delta DC signal, replacing the input signal with a test local oscillator signal, applying in turn the zero and ninety degree phase shifted local oscillator signal to the downconverting frequency translation device for respectively providing zero and ninety degree phase shifted calibration DC signals, measuring in turn the zero and ninety degree phase shifted calibration DC signals, subtracting respectively the measured zero and ninety degree phase shifted null DC offset signals from the zero and ninety degree phase shifted calibration DC signals for respectively providing an in phase calibration delta DC signal and a quadrature phase calibration delta DC signal, measuring the power of the test local oscillator signal to provide a test local oscillator power value, calculating a DC calibration value from the in phase and the quadrature calibration delta DC signals and the test local oscillator power value, and adjusting the low pass equivalent of the input signal by adding the in phase and the quadrature phase test delta DC signals multiplied by the DC calibration value.

9. The method of the claim 6 method further comprises the steps of, applying in turn a zero, ninety, one hundred and eighty and two hundred and seventy degree phase shifted local oscillator signal to the downconverting frequency translation device to respectively provide zero, ninety, one hundred and eighty and two hundred and seventy degree phase shifted test DC signals, measuring zero, ninety, one hundred and eighty and two hundred and seventy degree phase shifted test DC signals for the downconverting frequency translation device, removing the input signal, applying in turn a zero, ninety, one hundred and eighty and two hundred and seventy degree phase shifted local oscillator signal to the downconverting frequency translation device to respectively provide zero, ninety, one hundred and eighty and two hundred and seventy degree phase shifted null DC offset signals with the input signal removed, measuring the zero, ninety, one hundred and eighty and two hundred and seventy degree phase shifted null DC offset signals with the signal input removed, subtracting respectively the zero, ninety, one hundred and eighty and two hundred and seventy degree phase shifted null DC offset signals from the zero, ninety, one hundred and eighty and two hundred and seventy degree phase shifted test DC signal for respectively providing zero, ninety, one hundred and eighty and two hundred and seventy degree phase shifted test delta DC signals, subtracting the one hundred and eighty degree test delta DC signal from the zero degree phase shifted test delta DC signal to provide an in phase test delta DC signal, subtracting the two hundred and seventy degree test delta DC signal from the ninety test delta DC signal to provide a quadrature phase test delta DC signal, replacing the input signal with a test local oscillator signal, applying in turn the zero, ninety, one hundred and eighty and two hundred and seventy degree phase shifted local oscillator signal to the downconverting frequency translation device for respectively providing zero, ninety, one hundred and eighty and two hundred and seventy degree phase shifted calibration DC signals, measuring in turn the zero, ninety, one hundred and eighty and two hundred and seventy degree phase shifted calibration DC signals, subtracting respectively the measured zero, ninety, one hundred and eighty and two hundred and seventy degree phase shifted null DC offset signal from the zero, ninety, one hundred and eighty and two hundred and seventy degree phase shifted calibration DC signals for respectively providing zero, ninety, one hundred and eighty and two hundred and seventy degree phase shifted delta calibration DC signal, subtracting the one hundred and eighty degree phase shifted calibration delta DC signal from the zero degree calibration delta DC signal to provide an in phase calibration delta DC signal, subtracting the two hundred and seventy degree phase shifted calibration delta DC signal from the ninety degree phase shifted calibration delta DC signal to provide a quadrature phase calibration delta DC signal, measuring the power of the test local oscillator signal to provide a test local oscillator power value, calculating a DC calibration value from the in phase and the quadrature phase calibration delta DC signals and the test local oscillator power value, and adjusting the low pass equivalent of the input signal by adding the in phase and the quadrature test delta DC signals multiplied by the DC calibration value.

10. The method of claim 1 wherein the measurement step, the measuring is in the time domain.

11. The method of claim 1 wherein the measurement step, the measuring is in the time domain for providing a voltage over time measurement of the baseband signal in the time domain.

12. The method of claim 11 wherein the downconverter frequency response is in the frequency domain, the calculating step comprises the steps of, converting the baseband signal from the time domain to the frequency domain, and removing the downconverter frequency response from the baseband signal in the frequency domain.

13. A method of determining the frequency response of a device under test, the method comprising the steps of, receiving a microwave test signal by a downconverting frequency translation device, downconverting the microwave test signal into a test baseband signal by the downconverting frequency translation device, measuring the test baseband signal, exciting the device under test with the microwave test signal to produce a microwave response signal, downconverting the microwave response signal into a response baseband signal by the downconverting frequency translation device, measuring the response baseband signal, and calculating the frequency response of the device under test by dividing a Fourier transform of the response baseband signal by a Fourier transform of the test baseband signal.

14. The method of claim 13, wherein the test baseband signal comprises an in phase test baseband signal and a quadrature phase test baseband signal, the response baseband signal comprises an in phase response baseband signal and a quadrature phase response baseband signal, the method further comprising the steps of, providing a zero degree local oscillator signal to the downconverting frequency translation device for translating the microwave test signal into the in phase test baseband signal, and providing a ninety degree local oscillator signal to the downconverting frequency translation device for translating the microwave test signal into the quadrature phase test baseband signal, providing a zero degree local oscillator signal to the downconverting frequency translation device for translating the microwave response signal into the in phase response baseband signal, and providing a ninety degree local oscillator signal to the downconverting frequency translation device for translating the microwave response signal into the quadrature phase response baseband signal.

15. The method of claim 13 wherein the device under test is a nonlinear device under test, the method further comprising the steps of, determining a downconverter frequency response for a downconverting frequency translation device, adjusting the amplitude of the microwave test signal by a plurality of differing amplitudes, and repeating the receiving, downconverting, measuring, calculating steps for the microwave test signal a plurality of times for the plurality of differing amplitudes of the microwave test signal, exciting the device under test by the microwave test signal and adjusting the amplitude of the microwave test signal by the plurality of differing amplitudes, repeating the receiving, downconverting, measuring, calculating steps for the microwave response signal a plurality of times for the plurality of differing amplitudes of the microwave test signal for generating a plurality of the frequency responses, and determining the nonlinear characteristics of the nonlinear device under test from the plurality of frequency responses over the of the plurality of differing amplitudes.

16. The method of claim 15, wherein the test baseband signal comprises an in phase test baseband signal and a quadrature phase test baseband signal, the response baseband signal comprises an in phase response baseband signal and a quadrature phase response baseband signal, the method further comprising the steps of, providing a zero degree local oscillator signal to the downconverting frequency translation device for translating the microwave test signal into the in phase test baseband signal, and providing a ninety degree local oscillator signal to the downconverting frequency translation device for translating the microwave test signal into the quadrature phase test baseband signal, providing a zero degree local oscillator signal to the downconverting frequency translation device for translating the microwave response signal into the in phase response baseband signal, and providing a ninety degree local oscillator signal to the downconverting frequency translation device for translating the microwave response signal into the quadrature phase response baseband signal.

* * * * *